(12) United States Patent
Selin (10) Patent No.: US 7,123,096 B2
(45) Date of Patent: Oct. 17, 2006

(54) QUADRATURE OFFSET POWER AMPLIFIER

(75) Inventor: John R. Selin, Stow, MA (US)

(73) Assignee: Raytheon Company, Waltham, MA (US)

( * ) Notice: Subject to any disclaimer, the term of this patent is extended or adjusted under 35 U.S.C. 154(b) by 25 days.

(21) Appl. No.: 10/854,720

(22) Filed: May 26, 2004

(65) Prior Publication Data

US 2005/0264364 A1    Dec. 1, 2005

(51) Int. Cl.
*H03F 3/68* (2006.01)

(52) U.S. Cl. ................................ 330/295; 330/302
(58) Field of Classification Search ........... 330/295, 330/302, 51, 124 R
See application file for complete search history.

(56) References Cited

U.S. PATENT DOCUMENTS

| | | | |
|---|---|---|---|
| 5,256,987 A * | 10/1993 | Kibayashi et al. | 330/295 |
| 5,541,554 A | 7/1996 | Stengel et al. | |
| 5,903,854 A * | 5/1999 | Abe et al. | 455/575.1 |
| 6,320,462 B1 | 11/2001 | Alley | |
| 6,329,877 B1 | 12/2001 | Bowen et al. | |
| 6,894,561 B1 * | 5/2005 | Apel | 330/51 |
| 2004/0212437 A1 * | 10/2004 | Kim | 330/295 |

OTHER PUBLICATIONS

PCT/US2005/017629 International Search Report dated Sep. 5, 2005.

* cited by examiner

Primary Examiner—Robert Pascal
Assistant Examiner—Hieu Nguyen
(74) Attorney, Agent, or Firm—Daly,Crowley,Mofford & Durkee,LLP (57) ABSTRACT

An amplifier having a first transistor with an output coupled to a common output node and a switch for coupling a control electrode of the first transistor to a first bias source to bias such first transistor to a conducting state during a relatively high power operating mode or for removing such control electrode from the first bias source to place the first transistor in a non-conducting condition during a relatively low power operating mode selectively in accordance with a control signal. A second transistor has an output coupled to the common output node and a second bias source coupled to a control electrode to the second transistor to bias such second transistor to a conducting state during both the relatively high power operating mode and the relatively low power operating mode. First circuitry is coupled between an output of the second transistor and the common output node providing a different impedance at the output of the second transistor during the relatively high power operating mode than during the relatively low power operating mode. Second circuitry is coupled between the common input node and the control electrode of the second transistor device. The insertion phases of the of the first circuitry and the second circuitry is such that one of the two provides a nominal ninety-degree (i.e., substantially $(4n+1)\pi/2$ radians, where n is an integer including zero) phase lead and the other of the two provides a nominal ninety-degree (i.e., substantially $(4n+1)\pi/2$ radians, where n is an integer including zero) phase lag.

9 Claims, 4 Drawing Sheets

QUADRATURE OFFSET POWER AMPLIFIER

TECHNICAL FIELD

This invention relates to microwave frequency power amplifiers used in microwave frequency transmitters and in particular to an apparatus and method of achieving improved efficiency and linearity.

BACKGROUND

As is known in the art, commercial and military telecommunications systems over the past few years have shown a trend toward using digital modulation techniques. These digital systems require the capacity to handle a high density of carrier frequencies in order to remain cost effective. The additional trend toward space based systems imposes high efficiency and weight minimization constraints. Power amplifiers represent an important design challenge as they must conform to the above specifications. Unfortunately, high efficiency in power amplifiers has been difficult to attain for a large number of carrier frequencies. In fact, this is a direct trade-off in conventional amplifier design.

As is also known in the art, in telecommunications systems, satellite systems and other systems, it is desirable for radio frequency (RF) power amplifiers (PAs) to linearly amplify RF signals in a highly efficient manner. Efficiency is generally a function of RF output power level, and thus also a function of RF input level. For amplifier configurations with good efficiency performance, the efficiency varies approximately proportional to the square root of the RF output power level. High efficiency is typically not attained until an amplifier approaches its maximum output power. This, however, is not consistent with linear operation. Thus, a tradeoff must typically be made between achieving maximum efficiency and high linearity in RF power amplifier circuits.

Techniques suggested include reducing bias conditions for the RF transistors in the amplifier, or shutting off of some portion of the transistor in the amplifier. These approaches provided only minimal improvement in efficiency in the back-off power output region, i.e., the region backed off from the saturation region. One approach to reduce bias is to provide a switched loadline. One switched loadline technique uses a PIN diode switch in the output matching network. However, the PIN diode switch requires DC current in one of the on-off states and also adds RF loss that causes degradation of some of the efficiency gains.

SUMMARY

In accordance with the present invention, an amplifier is provided having a pair of amplifier sections coupled between a common input node and a common output node. A first one of the amplifier sections includes a first transistor having an output coupled to the common output node; a first bias source; and, a switch for coupling a control electrode of the first transistor to the first bias source to bias such first transistor to a conducting state during a relatively high power operating mode or for removing such control electrode from the first bias source to place the first transistor in a non-conducting condition during a relatively low power operating mode selectively in accordance with a control signal. A second one of the pair of amplifier sections includes a second transistor having an output coupled to the common output node; a second bias source coupled to a control electrode to the second transistor to bias such second transistor to a conducting state during both the relatively high power operating mode and the relatively low power operating mode. First circuitry is coupled between an output of the second transistor and the common output node providing a different impedance at the output of the second transistor during the relatively high power operating mode than during the relatively low power operating mode. Second circuitry is coupled between the common input node and the control electrode of the second transistor device. One of the first circuitry and the second circuitry provides a phase lead and the other one of the first circuitry and second circuitry provides a phase lag.

In one embodiment, the phase lead of one of the circuitry is substantially $(4n+1)\pi/2$ radians, where n is an integer including zero, and the phase lag of the other one of the circuitry is substantially $(4n+1)\pi/2$ radians.

In one embodiment, the second amplifier includes a switch for coupling a control electrode of the second transistor to the second bias source to bias such second transistor to a first conducting level during the relatively high power operating mode or to a third bias source to bias the second transistor to a second conducting level during the relatively low power operating mode selectively in accordance with said control signal.

With such an arrangement, the bias is switched by switches that connect the control electrodes of the transistors to current sources that cause the transistors to be operated at specific conducting states. The switch is set to either of its two states by a control signal that comes from a control module that is external to the amplifier and that is typically part of a system, such as a communication system, that uses the amplifier. The control signal is typically used to control the switch state of both of the pair of amplifier sections at the same time. In the high operating power mode, both of the amplifier sections are used in the high operating power state with each transistor set to its corresponding high operating power state. In the low operating power mode, the bias is switched off on the first one of the pair of amplifier sections, the bias is switched to a low operating power state on the second amplifier section. The bias on the second amplifier may be the same for both the high and low power operating states, in which case there is no switch necessary to change the bias state for the second amplifier section. Thus, using a switched bias in the back-off, i.e., low operating power, mode improves the efficiency as distinguished from an arrangement which uses the Doherty mode of self-bias under drive to effectively turn on the peak amplifier stage.

In one embodiment, a load presents an impedance Zo at the common output node. The impedance at the output of the first one of the transistors is 2Zo during the relatively high power operating mode. During a relatively low power operating mode, the first one of the transistors is non-conducting so that there is no signal from that transistor to be applied to the common output node. The circuitry coupled between an output of the second transistor and the common output node has a characteristic impedance $ZCI_1 = 2Zo$. Such circuitry provides an impedance at the output of the second transistor during the relatively high power operating mode of 2Zo and an impedance at the output of the second transistor of $(ZCI)^2/Zo$ during the relatively low power operating mode.

In one embodiment, both the amplifier sections have the transistors therein bias switched with a common control signal which sets the bias states of the two transistors to either the high operating power state or the low operating power state. In the high operating power state, the two amplifier sections have the transistors therein biased to their respective conducting bias current values. In the low operating power state (i.e., during back-off), a first one of the pair of amplifier sections has the transistor therein effectively shut off from bias, and therefore no current is supplied to the base of such transistor. The second one of the amplifier section has the transistor therein set to its conducting bias current value for better efficiency. However, in a more basic configuration without a bias switch on the second amplifier section, the transistor does not have to be switched and can be left at its bias current value. In this basic case, the efficiency would not be as good as with the switching, but would still be much better than with a simple amplifier without this invention.

In one embodiment, the phase lead and phase lag circuitry (i.e., the quadrature offset sections) are adjacent to the input and output of the transistors inside of the matching circuitry of the total amplifier. Without this invention, matching networks would typically be used at the inputs and outputs of the transistors in both of the two amplifier sections. The approach with this invention simplifies the matching circuitry so that only single matching networks are used at the input and output of the combined amplifier sections. This removes two of the matching networks that would otherwise be used when each amplifier section is separately matched at each of the inputs and outputs in the two amplifier sections.

In one embodiment, the phase lead circuitry (i.e., a negative delay section) is used at the input of the transistor in the second one of the amplifier sections. The phase lag circuitry is at the output of the transistor of the second one of the amplifier sections. This phase lead circuitry allows a simplified input splitting network that is compatible with the transistor operation in the full operating power and reduced operating power (i.e., back-off region) modes. This approach has the input of the transistor of the first one of the amplifier sections connected directly to the common input node. Thus when that transistor is switched off in the low operating power mode, the high input impedance of the off transistor would have a minimal impedance loading effect on that common node so that the RF signal applied to input of the total amplifier will still be applied to the input of the transistor of the second one of the amplifier sections. Without this invention, a phase lag network would typically be used at the input of the transistor in the first one of the amplifier sections while the input of the transistor of the second amplifier section would be connected to the common input node. In that case, when the transistor in the transistor in the first one of the amplifier sections in turned off, the phase lag network would cause an impedance transformation of the high input impedance at the input of the off transistor such that a low impedance would be imposed on the common input node. This low impedance on that node would then cause the RF input signal to be reduced significantly at that node such that very little of the RF signal would be applied to the input of the transistor of the second one of the amplifier sections and the gain of the total amplifier would be significantly reduced.

In one embodiment, the quadrature input section (e.g., the phase lead circuitry) at the input of the transistor of the second one of the amplifier sections would be implemented with lumped components, such as inductors and capacitors, connected together in a configuration that is typically referred to as a high-pass tee network. This component configuration would have an added advantage that the capacitors in the network would also provide a DC-blocking function, so that there would not be the need for another component to otherwise provide DC blocking.

In one embodiment, the quadrature output section (e.g., the phase lag circuitry) would be implemented with lumped components, such as inductors and capacitors, connected together in a configuration that is typically referred to as a low-pass pi network. This component configuration would allow the DC collector current to pass through the section so as to allow the use of one collector bias feed to provide the DC collector bias to both amplifier sections. Furthermore, some or all of the reactance of the shunt capacitor may be absorbed into the output matching network that is typically used at the output of the total amplifier. The typical output matching network would be able to absorb the additional reactance by modifying the values of the components of the network without adding components. Thus, at least one of the components of the quadrature network could be eliminated by this reactive absorption approach. The remaining shunt capacitor and series inductor would be left to be implemented as part of the quadrature network.

With the arrangements described above, a quadrature offset amplifier is provided having a loadline switching approach that is inherent in the configuration of the transistors in conjunction with a reduced bias condition and shutting off some portion of the RF transistors in the amplifier. The loadline (i.e., load impedance) is transformed appropriately by the quadrature output section when one of the RF transistors is shut off so that there are no extra components, which would typically have inherent RF loss, to degrade the improvement. The few additional components used to implement the quadrature offset sections are easily incorporated into typical amplifiers, and at least some of the RF effects of the components can be merged into the circuitry that is already used to complete the matching circuitry of the typical amplifier. The bias conditions for the two states are easily set up to be controlled by an external DC voltage signal and provide consistent RF performance.

Further, the quadrature offset amplifier provides a loadline (i.e., impedance) switching approach that is implemented by the configuration of the circuitry around two parallel RF transistors that make up the power amplifier stage. A quadrature phase delay section (i.e., phase lag) in the output circuit inherently provides a higher loadline (i.e., impedance) to one of the transistors when the other transistor is shut off. The high impedance loadline and an additional reduced bias setting on the transistor results in an improvement of the efficiency by about a factor of two for operation of the amplifier in the back-off mode. The output quadrature in a low-pass form is easily integrated with the typical output match circuit and bias feed. The quadrature section in the input uses a phase lead circuitry that simplifies implementation in the circuit and minimizes detrimental effects caused by the switching of the bias modes of the transistors.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
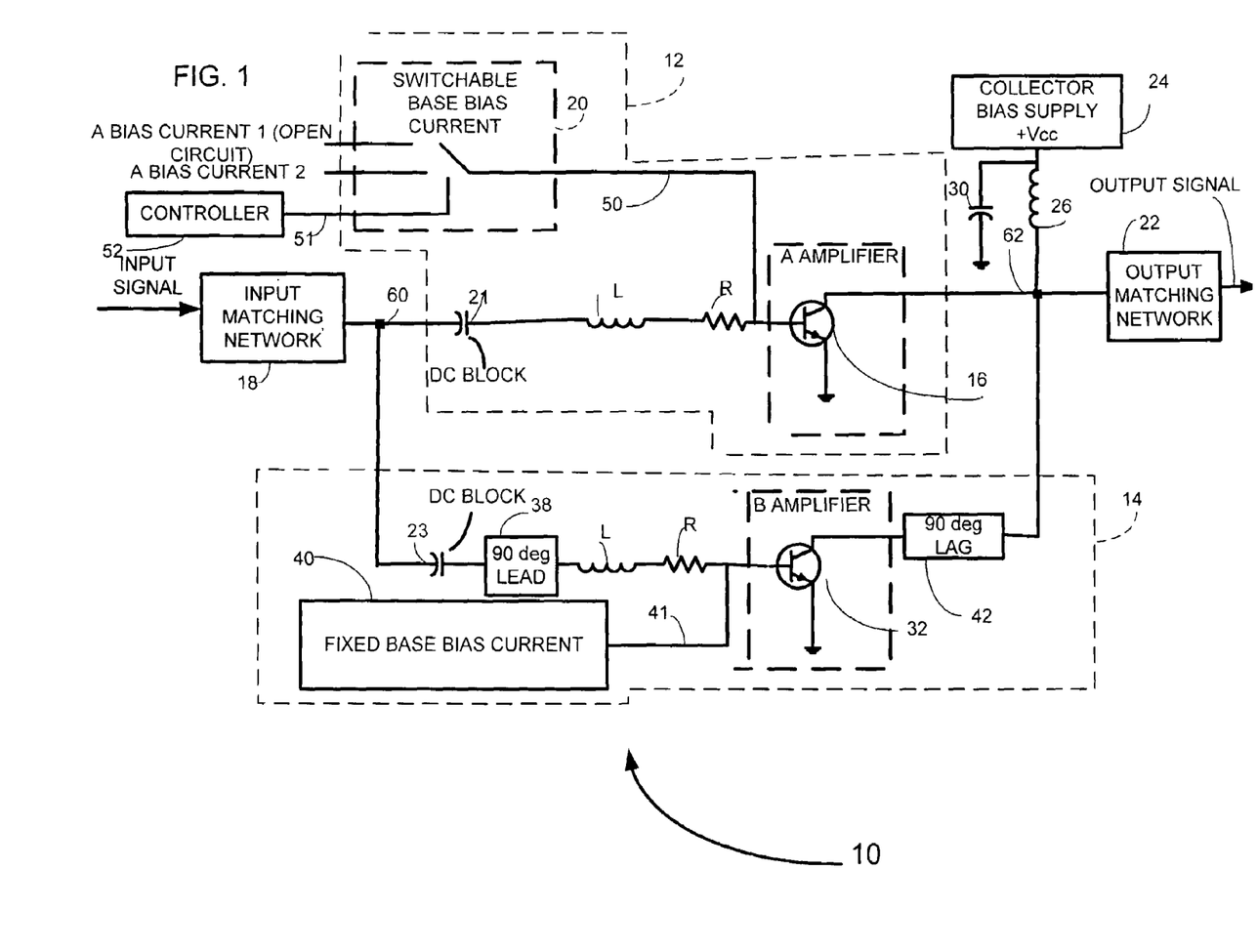
FIG. 1 is a schematic block diagram of an amplifier according to the invention.

Referring now to FIG. 1, a radio frequency signal amplifier 10, here a Quadrature Offset Power Amplifier, includes a pair of amplifier sections 12, 14. Here, in this embodiment, amplifier section 12 includes: a transistor 16, here for example, a bipolar transistor, having an input, or control electrode, here a base electrode, coupled to: (1) the output of an input impedance matching network 18, through a series circuit having a dc blocking capacitor 21; and (2) a base current bias network 20, here a switchable bias network, as shown. The amplifier section 12 here includes additional compensation/stabilization/reactive tuning components connected between the dc blocking capacitor 21 and the base electrode of transistor 16, such as a series inductor L and/or series resistor R, as shown. It should be understood that the inductor L and resistor R may not be required.

Figures 2A, 2B:
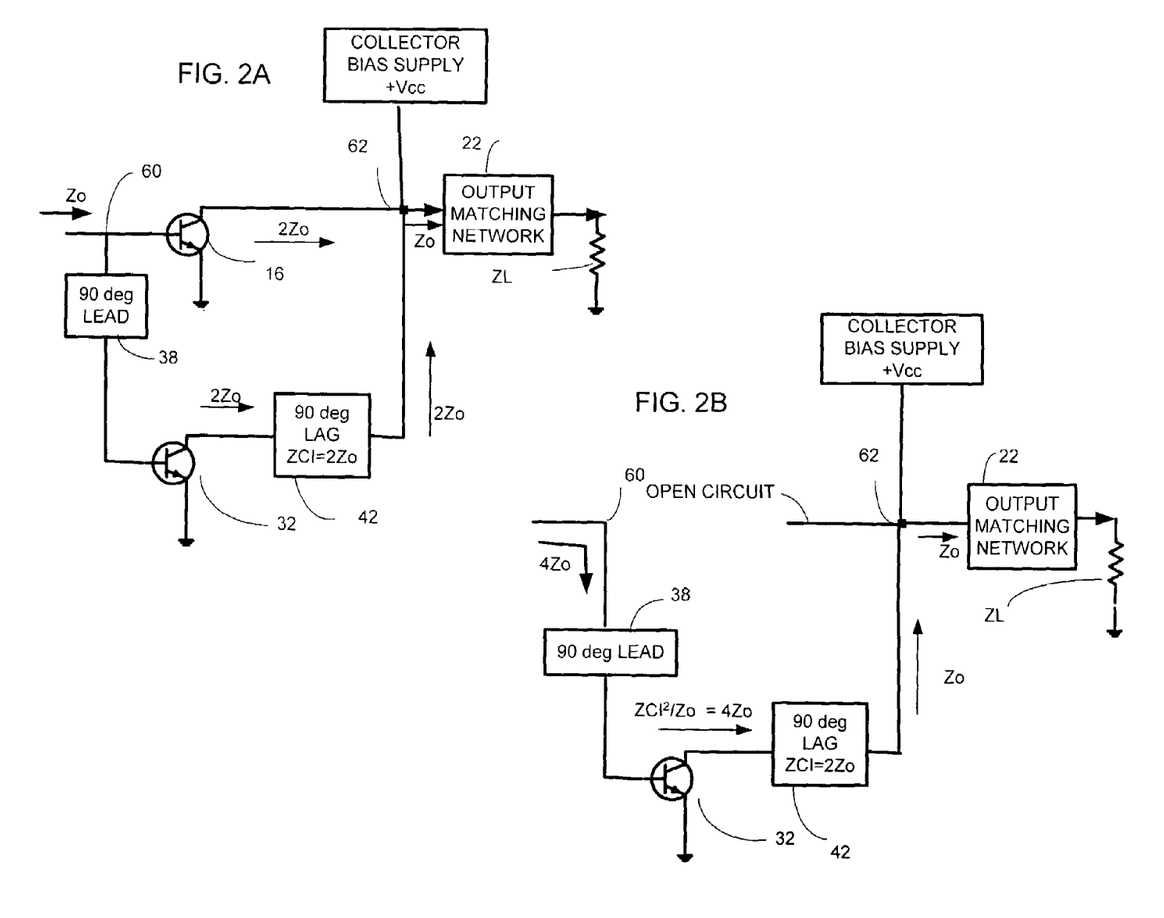
FIG. 2A is a schematic block diagram of the amplifier of FIG. 1 when such amplifier is in the high power operating mode.
FIG. 2B is a schematic block diagram of the amplifier of FIG. 1 when such amplifier is in the low power-operating mode.

The output of the amplifier section 12, more particularly the collector of grounded emitter transistor 16, is connected to: (1) the input of an output matching network 22; and, (2) a collector bias supply 24, here +Vcc, through an inductor 26. It is noted that the inductor 26 and collector bias supply 24 are connected to ground through a capacitor 30, as shown. The output matching network 22 is coupled to a load ZL (FIGS. 2A and 2B). The impedance provided by the output matching network 22 and the connected load ZL (FIGS. 2A and 2B) at output node 62 is Zo.

Figure 1A:
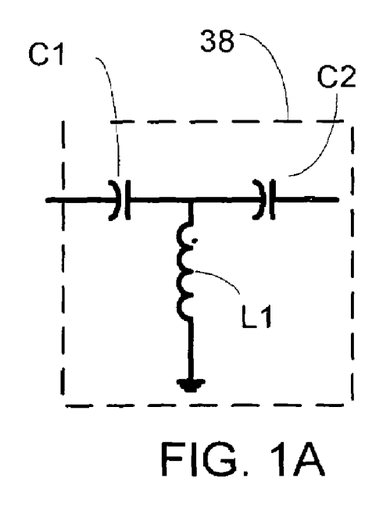
FIG. 1A is a schematic diagram of a phase lead network suitable for use in the amplifier of FIG. 1.

Amplifier section 14 includes: a transistor 32, here for example, a bipolar transistor, having an input, or control electrode, here a base electrode, coupled to the output of the input impedance matching network 18 through a series circuit having a dc blocking capacitor 23 and 90 degree lead circuitry 38. The 90 degree lead circuitry 38 provides a nominal ninety-degree (i.e., substantially $(4n+1)\pi/2$ radians, where n is an integer including zero) phase lead to the signals passing therethrough. Here, the circuitry 38 is formed with lumped elements as shown in FIG. 1A, here as tee-ladder network having a pair of series capacitors C1 and C2 and a shunt inductor L1, as shown. The control electrode of transistor 32 is also connected to a base bias network 40, here a fixed bias network, via line 41, as shown.

Here, as with amplifier section 12, amplifier section 14 includes additional compensation/stabilization/reactive tuning components connected between the dc blocking capacitor 23 and the base electrode of transistor 21, such as a series inductor L and/or series resistor R, as shown. It is noted that such inductor L and resistor R may not be required. In general, the equivalent stabilization and tuning could also be absorbed into the input matching circuitry 18. In those cases with these components positioned at the base terminal of the transistors, 16 and 32, the same components with the same values would be used at the inputs of both transistors. The new values for the input impedances of the transistors combined with these tuning components would now be used instead of the value of the impedances of just the transistors alone in order to determine the design of the circuitry in the input lead network 38 and the input matching circuit 18.

Figure 1B:
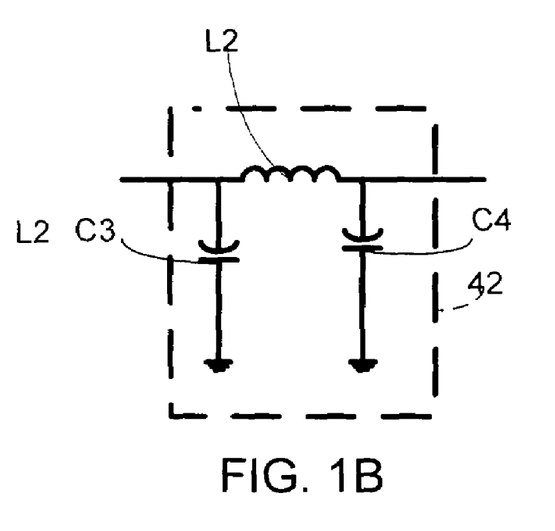
FIG. 1B is a schematic diagram of a phase lag network suitable for use in the amplifier of FIG. 1.

The output of the amplifier section 14, more particularly the collector of grounded emitter transistor 32, is connected to the input of the output matching network 22 through circuitry 42, here circuitry providing a nominal ninety-degree (i.e., substantially $(4n+1)\pi/2$ radians, where n is an integer including zero) phase lag for signals passing therethrough, coupled to the collector bias supply 24 through the inductor 26, as shown. Here, in this embodiment, the ninety degree lag network 42 is shown in FIG. 1B as pi-ladder network having a pair shunt capacitors C3 and C4 and a series inductor L2, as shown. It should be understood that the circuitry 42 may be for example, a quarter wave transmission line, for example, strip transmission line circuitry or microstrip transmission line circuitry. The impedance seen looking from node 62 into the output matching network 22 is Zo. The characteristic impedance ZCI of the lag network circuitry 42 is equal to 2Zo.

The switchable base current bias network 20 operates in response to a control signal on line 51 to select as the base bias current on line 50 for transistor 16 either a bias current 1 or bias current 2, where here bias current 1 is zero, i.e., an open circuit.

The control signal on line 51 typically comes from a smart system controller 52, such as the phone processor chip where the amplifier 10 is used in a cell phone, for example, that controls all of the functions in such cell phone. That processor 52 typically determines the level of RF power output needed to maintain good signal integrity based on the two-way handshaking carried out between the phone and a base station, not shown. The same approach is used in wireless LAN configurations where smart processors control the signal levels. In a more simplistic scenario, the control signal on line 51 could be a manual switch that would be set based on the user's preference whether to operate in a high power or low power state. The desired state may be chosen based on a number of factors, such as battery life, interference effects, quality of transmission, data rate, etc.

The processor 52 switches off the bias on one of the sides of the amplifier 10 (i.e., in this embodiment, switches off transistor 16 while transistor 32 remains biased on) in the low operating power state, as when the cell station for example is close to the cell phone, and uses both sides of the amplifier 10 (i.e., biases transistor 16 on while transistor 32 remains biased on) in the high operating power state, as when the cell station for example is relatively distant from the cell phone.

Quadrature Offset Power Amplifier 10 Operation

The baseline quadrature offset power amplifier 10 is a one-stage amplifier with the RF transistor split into two parallel transistor sections 12, 14 tied together at common RF input and output ports 60, 62, respectively. The RF transistor 16 in the upper RF path, or section 12, is essentially tied directly to the common input and output nodes 60, 62. The RF transistor 32 in the lower RF path or section 14 has quadrature offsets at its input and output between the common input, output nodes 60, 62, respectively. The quadrature offsets are desired to provide insertion phase shifts of equal magnitudes of substantially 90 degrees, but with opposite polarities, by the lead and lag networks 38, 42, respectively. As shown in the schematic, the input offset has an insertion phase of +90 degrees, equivalent to a quadrature phase lead, provided by the ninety-degree lead network 38 (FIG. 1A). The output offset has an insertion phase of −90 degrees, equivalent to a quadrature phase lag provided by the ninety-degree lag network 42 (FIG. 1B). Because of the opposite phase polarities, (i.e., a lead and lag) the lower path, i.e., network 14, does not have any net difference in insertion phase compared to the upper path i.e., network 12. Therefore, the RF signal power from each of the paths or networks 12, 14 combines in phase at the common output node 62.

Each transistor or amplifier section 12, 14 has its own base bias supply 20, 40, respectively, so that each section 12, 14 can be separately controlled by the base bias current settings. A single collector supply 24, here a fixed voltage, Vcc, provides the common collector bias to both sections 12, 14 with a connection at node 62 in front of output circuitry 22.

The amplifier 10 can be operated in a high operating power mode by setting the base bias conditions for both the upper and lower transistors 16, 32 to the same condition that would typically be used for best RF output power, power added efficiency, gain and linearity for the intended application. The amplifier 10 will also be operated with lower RF input drive levels, the so-called back-off condition. To get the best efficiency at maximum power and in back-off, the amplifier base bias condition is typically set to operate the RF transistors 16, 32 in near class-B mode. In class-B mode, the DC collector current in the RF transistors 16, 32 will fall as the input signal is reduced below the level necessary to drive the amplifier 10 to maximum RF output power levels. Since the current is dropping as the output power level falls, the efficiency in back-off is usually acceptable, though that efficiency is less than the peak efficiency reached at the highest output power levels as the amplifier 10 goes into gain compression.

The output impedance loadline presented to the RF transistors 16, 32 at their collectors is one of the key parameters that determine the maximum output power at compression, the efficiency and linearity of the amplifier 10. The value of the impedance load line determines the characteristic of the RF signal at the collectors of the transistor, such as the peak RF voltage and current waveforms for a given level of operating output power. The value of impedance that provides the best performance for efficiency and linearity is primarily a function of the DC collector supply voltage and the RF output power level. The efficiency of the amplifier 10 can be improved when operated at the back-off power levels if the output impedance loadline were set to an impedance value that is more appropriate for the selected lower level of output power in back-off. However, typically with that alternate load line set at a value that is better for back-off power levels, the amplifier would not be able to satisfy the required performance at the normal high operating power levels.

The quadrature offset amplifier 10 has the ability to provide an alternate loadline by setting the base bias conditions to an alternate state that effectively shuts off the upper RF transistor 16 when it is desired to operate under back-off operating conditions. The lower RF transistor 32 is still biased on and provides the RF output power to the output. In this alternate bias condition, called the back-off condition, the amplifier 10 shows improved efficiency at the back-off drive levels, while still meeting the required linearity. The quadrature offset amplifier 10 can typically double the value of efficiency obtained at the back-off level compared to the efficiency obtained with a similar amplifier where the load line is kept constant at a value that is best only for the high operating power levels.

The equivalent circuit for the output portion of the amplifier 10 during the high power operating mode, i.e., when both transistors 16 and 32 are biased on, is shown in FIG. 2A. The equivalent circuit for the output portion of the amplifier 10 during the low power operating mode (i.e., when transistor 32 is biased on and transistor 16 is off, the base thereof is connected to an open circuit) is shown in FIG. 2B.

Thus, referring to FIG. 2A, during the high power operating mode when both transistors 16 and 32 are on, the impedance at the outputs, i.e., collectors, of the transistors 16 and 32 are each 2Zo, since, as noted above, the characteristic impedance ZCI of the lag network circuitry 42 is also equal to 2Zo. The effective, i.e., parallel combination of these two impedances is therefore Zo, the same as the load impedance provided at output node 62 by the output matching network 22 and connected load ZL On the other hand, during the low power operating mode when transistor 16 is off while transistor 32 is on, the impedance looking back into the output, i.e., collector, of the transistor 16 is relatively high, (i.e., an open circuit), as shown in FIG. 2B. Thus, the impedance at the output of the lag network 42 is also Zo. As noted above, the characteristic impedance ZCI of the lag network circuitry 42 is equal to 2Zo. Therefore, the impedance at the output (i.e., collector) of transistor 32 is $(ZCI)^2/Zo=(2Zo)^2/Zo=4Zo$.

Therefore, while during the high power operating mode when both transistors 16 and 32 are conducting, the effective, i.e., parallel, combination of these two impedances is Zo, which is the same as the impedance provided at output terminal 62 by output matching network 22 and load ZL. However, during the low power operating mode when transistor 16 is off and transistor 32 is on, the impedance at the output of conducting transistor 32 is 4Zo, an increase by a factor of 4, in this example.

Load Line Switching with the Quadrature Offset Section 14

The quadrature offset section 42 in the output is incorporated in the amplifier 10, but does not impact the operation of the amplifier 10 when operated in full power mode with both transistors 16 and 32 turned on. In a typical implementation of the amplifier 10 the upper and lower transistors 16, 32 would be the same size. When the amplifier 10 is in the full operating power bias condition with both transistors 16, 32 turned-on, the loadline impedance presented to each transistor would be twice the equivalent impedance provided by the output matching network 22 because of symmetry. The characteristic impedance of the output quadrature offset section 42 would be the same as the load line looking out from the quadrature offset section 42 into node 62, so that the section 42 would not affect the loadline impedance. While the amplifier section 14 provides the 90 degree phase lag with network 42 on the output side of transistor 32, a corresponding input quadrature section of amplifier section 14 with the phase lead network 38 provides an insertion phase that cancels the effect of the output lag network such that the two transistors 16, 32 operate effectively in phase in the full operating power mode. Each transistor 16, 32 would be supplying half of the total amplifier 10 output power into its own loadline and the combined amplifier 10 would be able to meet the required performance in the high power output operating mode.

The quadrature offset in the output is the key to providing the alternate loadline when the upper transistor 16 is shut off in the back-off bias condition. Since the off transistor 16 is not supplying any power to the common output node 62, the lower transistor 16 will be presented with a different loadline than in the full operating power mode. The impedance at the common output node 62, which is half of the effective impedance of the quadrature section 14, is transformed to four times the impedance value at common output node 62 because of the well known effect of quarter-wave transmission line transformers provided by the lag network 42. Though the quadrature section lag network 42 is shown implemented with as low-pass pi section 42, the values of the shunt capacitors C2 and C3 and series inductor L3 provide the equivalent RF performance as a lumped-element version of the quarter-wave RF transmission line, whether microstrip, stripline, or waveguide, for example. Thus the loadline seen by the lower transistor 32 in the low operating mode is twice the value that it would normally see in the high operating power mode, and is four times the value of the loadline of the combined amplifier 10 loadline in the full operating power state.

With this alternate high value of load line impedance, the amplifier 10 in this back-off mode would see its output operating power capability reduced by the same factor of four, compared to the power capability of the amplifier 10 in the high power mode. This lower power capability is typically consistent with the performance requirements for operation in the back-off mode. However, with this alternate load line, the efficiency of the amplifier 10 in the back-off mode would be improved by about a factor of 2 at the back-off output power level compared to the efficiency obtained at the back-off output power level for the amplifier 10 when operating in the high power mode.

Base Bias Switching

Figure 3:
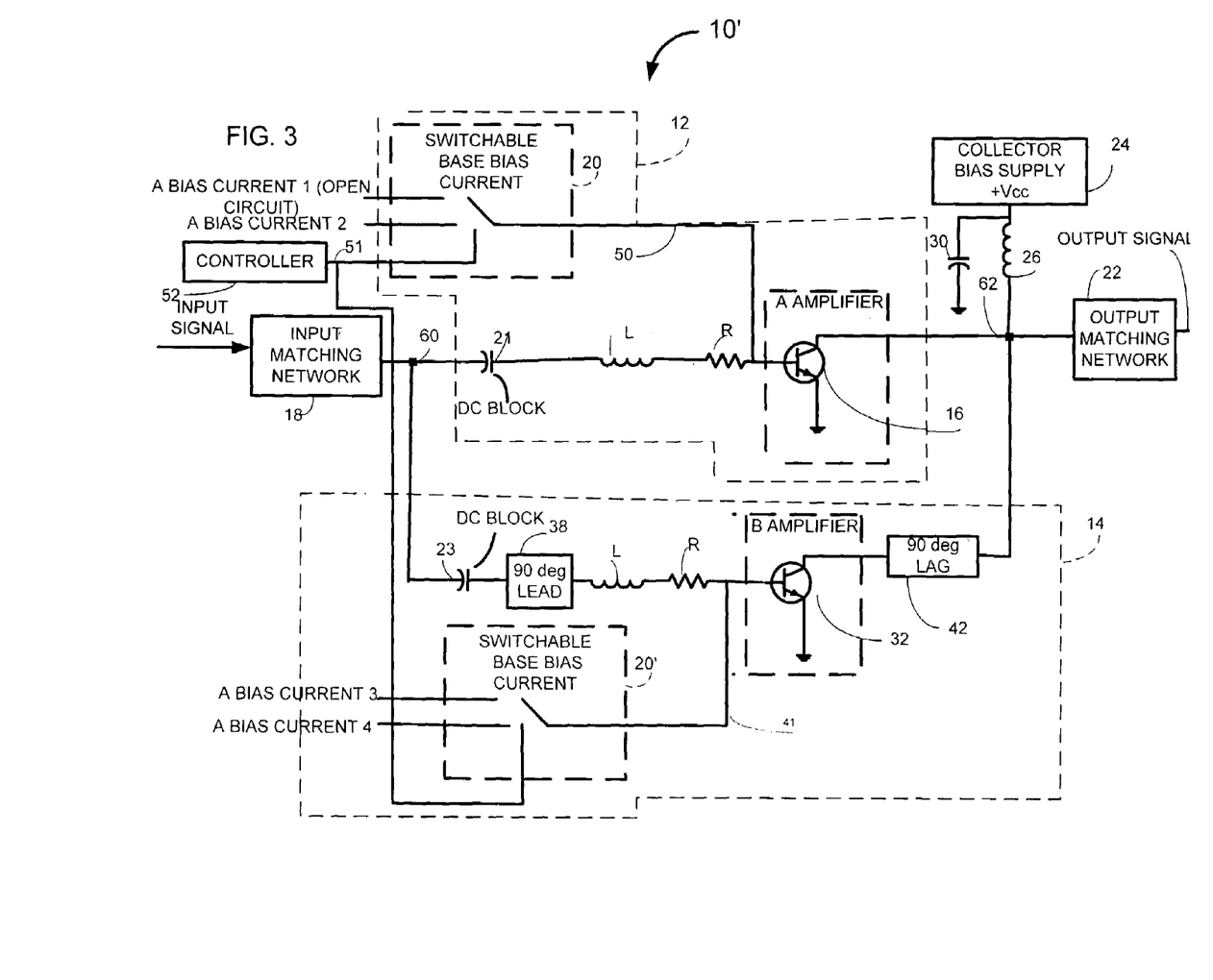
FIG. 3 is a schematic block diagram of an amplifier according to an alternative embodiment of the invention.

In order to see the full improvement of the efficiency in the back-off mode, the base bias for the lower transistor 32 would typically be set to a lower quiescent current level, which is closer to a true class-B bias condition. The switch to this lower quiescent bias for the transistor 32 allows the collector current of transistor 32 to drop to lower values as the RF drive power is reduced for this back-off condition and so gives the full benefit of the efficiency improvement in back-off. This reduced quiescent bias setting would be accomplished, as shown in FIG. 3, with the switchable bias circuitry 20' supplying the alternate bias current to the control electrode of transistor 32. The switchable bias circuitry 20' changes the current level from a bias current level 3 (i.e., from a current bias source 3) to a bias current level 4 (i.e., from a current bias source 4). The change to a lower quiescent bias on transistor 32 would be done at the same time as the upper transistor 16 is shut off through its own base bias circuitry 20. The controller 52 provides a common switch signal on line 51 to both switchable current sources 20 and 20'. The switchable current source 20' is set by the control signal on line 51 from the controller 52 based on the desired operating conditions as determined for the amplifier section 12 with the smart controller 52.

Typically, the switchable bias circuitry, shown as 20 and 20', would be configured from a combination of simple transistors, not shown, resistors, not shown, and inverter stages, not shown, in order to provide the two sets of bias conditions for the upper and lower transistors 16, 32 for the two operating modes.

For amplifier 10:

During the high power-operating mode, the bias current for amplifier section 12 is a relatively high current level (i.e., the current level 2 is relatively high) and during the low power-operating mode the bias current for amplifier section 12 is relatively low (here an open circuit). During both the high and low power-operating modes, the bias current for amplifier section 14 is a relatively high current level.

For amplifier 10':

During the high power-operating mode, the bias current for amplifier section 12 is a relatively high current level (i.e., the current level 2 is relatively high) and during the low power-operating mode the bias current for amplifier section 12 is relatively low (i.e., the current level 1 is relatively low, here an open circuit). During the high power-operating mode, the bias current for amplifier section 14 (current 3, FIG. 3) is a relatively high current level while during the low power operating mode the bias current level for amplifier section 14 (current 4, FIG. 3) is a relatively low current level.

Input Quadrature Offset Effects

The primary function of the quadrature offset section 14 in the input circuit is to equalize the insertion phase of the lower RF path, i.e., section 14, with the upper RF path, section 12. As shown in the schematic in FIG. 1, the section 14 provides a phase lead using lead network 38 to cancel the phase lag of lag network 42. The lead network 38 has a characteristic impedance ZCLB that is typically about the same as the input impedance of the lower transistor 32, so that the impedance seen looking into the input of the quadrature section 14 would be that of the lower transistor 32. When the amplifier 10 is operated in the high power mode, the upper transistor 16 is also biased similarly to the same state as the lower transistor 32, so that the input impedance of transistor 16 is about the same as that of transistor 32. The matching circuit 18 at the input of the amplifier 10 is designed to match the equivalent parallel impedance of the two RF paths, i.e., sections 12, 14 combined at the common node connection at 60. The upper path, i.e., section 12 transistor 16 is directly connected to that node, while the lower path transistor 32 has the quadrature section, i.e., lag network 38, in between the transistor 32 and the node 60. The parallel impedance of the two RF paths is approximately half of the impedance at the input of each of the transistors, 16 and 32.

When the amplifier 10 is operating in full power mode with both the upper and lower transistor 16, 32 fully biased on, the RF input signal splits equally between the two RF paths, i.e., sections 12, 14, so that both transistors 16, 32 are driven with the same RF power. As seen from the input of the whole amplifier 10, at the input of matching circuit 18, the input impedance would be matched to the desired external characteristic impedance, which is typically 50 ohms. When the amplifier 10 is switched to the low operating power mode, the upper transistor 16 is turned off, which causes its input impedance to change to a higher value of impedance, typically significantly higher than the input impedance of the transistor when biased on. The impedance seen at the common input node 60 would now be higher, approximately twice as high since the node 60 is loaded with only the impedance of just the lower path or section 14. In this case, the input of the amplifier 10 would be mismatched when operating in this low operating power mode.

Referring to amplifier 10' shown in FIG. 3, a switchable base bias circuit 20' is used in place of the fixed current bias circuit 20 shown in FIG. 1. The switchable base bias circuit 20', as shown in FIG. 3, is used for switching the base bias current on line 41 such that the lower transistor 32 is biased into the lower operating power mode. That change in bias for transistor 32 would tend to increase the impedance at the input of the transistor 32. That marginally larger value of impedance would be transformed to a lower impedance by the input lead network 38 because of the impedance transforming effect of the 90 degree phase lead network 38. Therefore, at the common node 60 on the input, the impedance seen for the low operating power mode will be shifted to a value that is closer to the impedance seen at that node for the amplifier when biased for the high power operating power mode. Therefore, in the case with the switchable base bias for transistor 32, the input match of amplifier 10' would also be shifted to a value closer to the desired external characteristic impedance. In this case, the input impedance of amplifier 10' would be acceptable for both the high and the low operating power modes.

A number of embodiments of the invention have been described. Nevertheless, it will be understood that various modifications may be made without departing from the spirit and scope of the invention. Accordingly, other embodiments are within the scope of the following claims.

What is claimed is:

1. An amplifier, comprising:
a pair of amplifier sections coupled between a common input node and a common output node;
  (A) a first one of the amplifier sections having:
    (i) a first transistor having a first electrode, an output electrode coupled to the common output node, and a control electrode for controlling a flow of current between the first electrode and output electrode;
    (ii) a first bias source;
    (iii) a switch for coupling the control electrode of the first transistor to the first bias source to bias such first transistor to a conducting state during a relatively high power operating mode or for removing such control electrode from the first bias source to place the first transistor in a non-conducting condition during a relatively low power operating mode selectively in accordance with a control signal; and
  (B) a second one of the amplifier sections having:
    (i) a second transistor having a first electrode, an output electrode, and a control electrode for controlling a flow of current between the first electrode and the output electrode of the second transistor;
    (ii) a second bias source coupled to the control electrode of the second transistor to bias such second transistor to a conducting state during both the relatively high power operating mode and the relatively low power operating mode;
    (iii) first circuitry, coupled between the output of the second transistor device and the common output node;
    (iv) second circuitry coupled between the common input node and the control electrode of the second transistor device;
  (C) wherein one of the first circuitry and the second circuitry provides a phase lead and the other one of the first circuitry and second circuitry provides a phase lag;
  (D) wherein the first circuitry includes a phase shifting network providing a phase shift between the output of the second transistor and the common output node different from the phase shift between the output of the first transistor and the common output node; and
  (E) a DC voltage source coupled to the common output node.

2. The amplifier recited in claim 1 wherein the phase lead is substantially $(4n+1)\pi/2$ radians, where n is an integer including zero, and the other one of the first circuitry and the phase lag is substantially $(4n+1)\pi/2$ radians, where n is an integer including zero.

3. An amplifier, comprising:
a pair of amplifier sections coupled between a common input node and a common output node;
  (A) a first one of the amplifier sections having:
    (i) a first transistor having a first electrode, an output coupled to the common output node, and a control electrode for controlling a flow of current between the first electrode and output electrode;
    (ii) a first bias source;
    (iii) a switch for coupling the control electrode of the first transistor to the first bias source to bias such first transistor to a conducting state during a relatively high power operating mode or for removing such control electrode from the first bias source to place the first transistor in a non-conducting condition during a relatively low power operating mode selectively in accordance with a control signal; and
  (B) a second one of the amplifier sections having:
    (i) a second transistor having a first electrode, an output electrode coupled to the common output node, and a control electrode for controlling a flow of current between the first electrode and output electrode of the second transistor;
    (ii) a second bias source coupled to the control electrode to the second transistor to bias such second transistor to a conducting state during both the relatively high power operating mode and the relatively low power operating mode;
    (iii) first circuitry, coupled between the output of the second transistor device and the common output node providing a different impedance at the output of the second transistor during the relatively high power operating mode than during the relatively low power operating mode;
    (iv) second circuitry coupled between the common input node and the control electrode of the second transistor device;
  (C) wherein one of the first circuitry and the second circuitry provides a phase lead and the other one of the first circuitry and second circuitry provides a phase lag;
  (D) wherein the phase lead is substantially $(4n+1)\pi/2$ radians, where n is an integer including zero, and the other one of the first circuitry and the phase lag is substantially $(4n+1)\pi/2$ radians, where n is an integer including zero;
  (E) including a load having an impedance Zo coupled to the common output node and wherein:
    the first circuitry has a characteristic impedance ZCI=2Zo, such circuitry providing an impedance at the output of the second transistor during the relatively high power operating mode of 2Zo and an impedance at the output of the second transistor of $(ZCI)^2/Zo$ during the relatively low power operating mode.

4. An amplifier, comprising:
a pair of amplifier sections coupled between a common input node and a common output node;
  (A) a first one of the amplifier sections having:
    (i) a first transistor having a first electrode, an output coupled to the common output node, and a control electrode for controlling a flow of current between the first electrode and output electrode;
(ii) a first bias source;
(iii) a switch for coupling the control electrode of the first transistor to the first bias source to bias such first transistor to a conducting state during a relatively high power operating mode or for removing such control electrode from the first bias source to place the first transistor in a non-conducting condition during a relatively low power operating mode selectively in accordance with a control signal; and
(B) a second one of the amplifier sections having:
(i) a second transistor having a first electrode, an output coupled to the common output node, and a control electrode for controlling a flow of current between the first electrode and the output electrode of the second transistor;
(ii) a second bias source coupled to the control electrode of the second transistor to bias such second transistor to a conducting state during both the relatively high power operating mode and the relatively low power operating mode;
(iii) first circuitry, coupled between an output of the second transistor device and the common output node providing a different impedance at the output of the second transistor during the relatively high power operating mode than during the relatively low power operating mode;
(iv) second circuitry coupled between the common input node and the control electrode of the second transistor device; and
(C) wherein one of the first circuitry and the second circuitry provides a phase lead and the other one of the first circuitry and second circuitry provides a phase lag;
(D) wherein the first circuitry includes a phase shifting network providing a the phase shift between the output of the second transistor and the common output node different from the phase shift between the output of the first transistor and the common output node; and
(E) wherein the second amplifier includes:
a switch for coupling the control electrode of the second transistor to the second bias source to bias such second transistor to a first conducting level during the relatively high power operating mode or to a third bias source to bias the second transistor to a second conducting level during the relatively low power operating mode selectively in accordance with said control signal.

5. The amplifier recited in claim 4 wherein the phase lead is substantially $(4n+1)\pi/2$ radians, where n is an integer where n is an integer including zero, and the other one of the first circuitry and the phase lag is substantially $(4n+1)\pi/2$ radians where n is an integer including zero.

6. The amplifier recited in claim 5 including a load having an impedance Zo coupled to the common output node and wherein:
the first circuitry has a characteristic impedance ZCI=2Zo, such circuitry providing an impedance at the output of the second transistor during the relatively high power operating mode of 2Zo and an impedance at the output of the second transistor of $(ZCI)^2/Zo$ during the relatively low power operating mode.

7. An amplifier, comprising:
a first transistor having a first electrode, an output coupled to an output node, and a control electrode for controlling a flow of current between the first electrode and output electrode;
a second transistor having a first electrode, an output coupled to the output node, and a control electrode for controlling a flow of current between the first electrode and the output electrode of the second transistor;
wherein the control electrode of the first transistor is coupled to an input node;
a first bias source;
a switch for coupling the control electrode of the first transistor to the first bias source to bias such first transistor to a conducting state during a relatively high power operating mode or for removing such control electrode from the first bias source to place the first transistor in a non-conducting condition during a relatively low power operating mode selectively in accordance with a control signal;
a second bias source coupled to the control electrode of the second transistor to bias such second transistor to a conducting state during both the relatively high power operating mode and the relatively low power operating mode;
first circuitry, coupled between an output of the second transistor and the output node;
second circuitry coupled between the input node and the control electrode of the second transistor;
wherein one of the first circuitry and the second circuitry provides a phase lead and the other one of the first circuitry and second circuitry provides a phase lag;
a DC voltage source coupled to the output node.

8. The amplifier recited in claim 7 wherein the phase lead is substantially $(4n+1)\pi/2$ radians, where n is an integer including zero and the other one of the first circuitry and the phase lag is substantially $(4n+1)\pi/2$ radians where n is an integer including zero.

9. An amplifier, comprising:
a pair of amplifier sections coupled between a common input node and a common output node;
(A) a first one of the amplifier sections having:
(i) a first transistor having an output coupled to the common output node;
(ii) a first bias source;
(iii) a switch for coupling a control electrode of the first transistor to the first bias source to bias such first transistor to a conducting state during a relatively high power operating mode or for removing such control electrode from the first bias source to place the first transistor in a non-conducting condition during a relatively low power operating mode selectively in accordance with a control signal; and
(B) a second one of the amplifier sections having:
(i) a second transistor having a first electrode, an output coupled to the common output node, and a control electrode for controlling a flow of current between the first electrode and the output electrode of the second transistor;
(ii) a second bias source coupled to control electrode to the second transistor to bias such second transistor to a conducting state during both the relatively high power operating mode and the relatively low power operating mode;
 (iii) first circuitry, coupled between an output of the second transistor device and the common output;
 (iv) second circuitry coupled between the common input node and the control electrode of the second transistor device;
(C) wherein one of the first circuitry and the second circuitry provides a phase lead and the other one of the first circuitry and second circuitry provides a phase lag;
(D) wherein the first circuitry includes a phase shifting network providing a phase shift between the output of the second transistor and the common output node different from the phase shift between the output of the first transistor and the common output node
(E) wherein the phase lead is substantially $(4n+1)\pi/2$ radians, where n is an integer including zero, and the other one of the first circuitry and the phase lag is substantially $(4n+1)\pi/2$ radians, where n is an integer including zero;
(F) including a load having an impedance Zo coupled to the common output node and wherein:
 the first circuitry has a characteristic impedance $ZCI=2Zo$, such circuitry providing an impedance at the output of the second transistor during the relatively high power operating mode of 2Zo and an impedance at the output of the second transistor of $(ZCI)^2/Zo$ during the relatively low power operating mode.

* * * * *

UNITED STATES PATENT AND TRADEMARK OFFICE
CERTIFICATE OF CORRECTION

PATENT NO. : 7,123,096 B2  
APPLICATION NO. : 10/854720  
DATED : October 17, 2006  
INVENTOR(S) : Selin Page 1 of 1

It is certified that error appears in the above-identified patent and that said Letters Patent is hereby corrected as shown below:

Abstract, line 21, delete "of the of the first" and replace with --of the first--.

Col. 2, lines 45-46, delete "power, mode" and replace with --power mode--.

Col. 3, line 39, delete "to input" and replace with --to the input--.

Col. 3, line 47, delete "in turned off," and replace with --is turned off,--.

Col. 6, line 11, delete "as" and replace with --as a--.

Col. 6, line 12, delete "having a pair shunt capacitors" and replace with --having a pair of shunt capacitors--.

Col. 8, line 44, delete "amplifier 10 the" and replace with --amplifier 10, the--.

Col. 9, line 10, delete "with as low-pass" and replace with --with a low-pass--.

Col. 10, line 45, delete "transistor 16, 32" and replace with --transistors 16, 32--.

Col. 13, lines 55-56, delete "where n is an integer where n is an integer including zero" and replace with --where n is an integer including zero--.

Col. 15, line 16, delete "output node" and replace with --output node;--.

Signed and Sealed this

Third Day of April, 2007

JON W. DUDAS  
*Director of the United States Patent and Trademark Office*